(12) United States Patent
Dezsi et al.

(10) Patent No.: US 12,224,218 B2
(45) Date of Patent: Feb. 11, 2025

(54) SEMICONDUCTOR PACKAGES WITH INCREASED POWER HANDLING

(71) Applicant: Wolfspeed, Inc., Durham, NC (US)

(72) Inventors: Geza Dezsi, Durham, NC (US); Devarajan Balaraman, Apex, NC (US); Brice McPherson, Fayetteville, AR (US)

(73) Assignee: WOLFSPEED, INC., Durham, NC (US)

( * ) Notice: Subject to any disclaimer, the term of this patent is extended or adjusted under 35 U.S.C. 154(b) by 182 days.

(21) Appl. No.: 17/670,174

(22) Filed: Feb. 11, 2022

(65) Prior Publication Data

US 2023/0260861 A1    Aug. 17, 2023

(51) Int. Cl.

| H01L 23/373 | (2006.01) |
| H01L 23/00 | (2006.01) |
| H01L 23/31 | (2006.01) |
| H01L 23/495 | (2006.01) |
| H01L 29/16 | (2006.01) |
| H01L 29/78 | (2006.01) |
| H01L 29/872 | (2006.01) |

(52) U.S. Cl.
CPC ...... *H01L 23/3107* (2013.01); *H01L 23/3735* (2013.01); *H01L 23/49562* (2013.01); *H01L 23/49568* (2013.01); *H01L 23/562* (2013.01); *H01L 29/1608* (2013.01); *H01L 29/78* (2013.01); *H01L 29/872* (2013.01)

(58) Field of Classification Search
CPC ............. H01L 23/49568; H01L 23/562; H01L 29/1608; H01L 29/872
See application file for complete search history.

(56) References Cited

U.S. PATENT DOCUMENTS

| 5,912,808 A | 6/1999 | Ikemoto |
| D432,097 S | 10/2000 | Song et al. |

(Continued)

FOREIGN PATENT DOCUMENTS

WO    2017027315 A1    2/2017

OTHER PUBLICATIONS

Notification of Transmittal of the International Search Report and the Written Opinion of the International Searching Authority, or the Declaration, in corresponding PCT Application No. PCT/US2023/061708 (Jul. 5, 2023).

*Primary Examiner* — Eugene Lee
(74) *Attorney, Agent, or Firm* — Myers Bigel, P.A.

(57) ABSTRACT

Semiconductor packages and, more particularly, semiconductor packages with increased power handling capabilities are disclosed. Semiconductor packages may include lead frame structures and corresponding housings that incorporate semiconductor die. To promote increased current and voltage capabilities, exemplary semiconductor packages include one or more arrangements of creepage extension structures, lead frame structures that may include integral thermal pads, additional thermal elements, and combinations thereof. Creepage extension structures may be arranged as part of top sides of semiconductor packages along with thermal pads of lead frame structures and additional thermal elements. Creepage extension structures may also be arranged as part of top sides and along on one or more peripheral edges of semiconductor packages to promote further increases in power handling.

33 Claims, 7 Drawing Sheets

(56) References Cited

U.S. PATENT DOCUMENTS

| | | |
|---|---|---|
| D510,915 S | 10/2005 | Horinouchi et al. |
| D511,331 S | 11/2005 | Horinouchi et al. |
| 7,242,582 B2 * | 7/2007 | Kurauchi ................ H01L 24/33 |
| | | 257/E23.092 |
| 8,450,845 B2 * | 5/2013 | Ikeda ................ H01L 23/49537 |
| | | 257/E23.101 |
| 9,142,493 B2 | 9/2015 | Fujino |
| D758,322 S | 6/2016 | Iwata et al. |
| 9,468,087 B1 | 10/2016 | Joshi |
| D824,866 S | 8/2018 | Matsubara et al. |
| 10,253,729 B2 * | 4/2019 | Oono ..................... F28F 21/00 |
| D852,765 S | 7/2019 | Nii |
| D853,343 S | 7/2019 | Nii |
| D856,947 S | 8/2019 | Nii |
| D901,405 S | 11/2020 | Saito et al. |
| D920,264 S | 5/2021 | McBride et al. |
| D932,452 S | 10/2021 | McBride et al. |
| D937,231 S | 11/2021 | Saxena |
| D969,762 S | 11/2022 | Saxena |
| D972,516 S | 12/2022 | Hara |
| D1,009,818 S | 1/2024 | Ono |
| D1,009,819 S | 1/2024 | Ono |
| 2003/0213979 A1 | 11/2003 | Nakajima et al. |
| 2005/0029634 A1 | 2/2005 | Ambrus |
| 2007/0052072 A1 * | 3/2007 | Iwade ..................... H01L 24/33 |
| | | 257/E23.092 |
| 2007/0216013 A1 * | 9/2007 | Funakoshi ............. H01L 24/40 |
| | | 257/691 |
| 2008/0020517 A1 * | 1/2008 | Kummerl ............... H01P 1/387 |
| | | 257/E23.092 |
| 2013/0021759 A1 | 1/2013 | Zschieschang et al. |
| 2016/0204046 A1 * | 7/2016 | Iwashige ............. H01L 29/1608 |
| | | 257/669 |
| 2017/0317006 A1 * | 11/2017 | Okumura ............... H01L 24/48 |
| 2019/0080973 A1 | 3/2019 | Otremba et al. |
| 2020/0273782 A1 * | 8/2020 | Quinones .......... H01L 23/49575 |
| 2021/0118778 A1 * | 4/2021 | Blansaer ............... H01L 21/561 |
| 2021/0175141 A1 * | 6/2021 | Kajihara ............... H01L 21/565 |
| 2021/0305166 A1 | 9/2021 | Moxey et al. |
| 2022/0028765 A1 | 1/2022 | Koduri |
| 2022/0122905 A1 * | 4/2022 | Schwab ............ H01L 23/49586 |
| 2022/0157686 A1 * | 5/2022 | Joanna Chye .... H01L 23/49524 |
| 2022/0359351 A1 * | 11/2022 | Kothandapani ..... H01L 23/3732 |
| 2023/0143679 A1 * | 5/2023 | Stella ................. H01L 23/3735 |
| | | 257/675 |
| 2023/0260861 A1 | 8/2023 | Dezsi et al. |

* cited by examiner

SEMICONDUCTOR PACKAGES WITH INCREASED POWER HANDLING

FIELD OF THE DISCLOSURE

The present disclosure relates to semiconductor packages and, more particularly, to semiconductor packages with increased power handling capabilities and/or smart sensing capabilities.

BACKGROUND

Semiconductor devices such as transistors and diodes are ubiquitous in modern electronic devices. Wide bandgap semiconductor material systems such as gallium arsenide (GaAs), gallium nitride (GaN), and silicon carbide (SiC) are being increasingly utilized in semiconductor devices to push the boundaries of device performance in areas such as switching speed, power handling capability, and thermal conductivity. Exemplary power semiconductor die include metal-oxide-semiconductor field-effect transistors (MOSFETs), insulated gate bipolar transistors (IGBTs), Schottky barrier diodes, PiN diodes, thyristors, and high electron mobility transistors (HEMTs).

For packaging of such power semiconductor die, the packaging technology plays an important role in the performance thereof. For example, the packaging of a power semiconductor device may limit the ability of the semiconductor die therein to dissipate heat, conduct current, and even switch at particular speeds (e.g., due to stray inductance). In this regard, packaging technology may be a bottleneck in the performance of packaged power semiconductor devices with high performance power semiconductor die, including semiconductor die that are based on silicon carbide material systems, among others.

The art continues to seek improved packaging of power semiconductor devices capable of overcoming challenges associated with conventional semiconductor devices.

SUMMARY

The present disclosure relates to semiconductor packages and, more particularly, to semiconductor packages with increased power handling capabilities. Semiconductor packages may include lead frame structures and corresponding housings that incorporate semiconductor die. To promote increased current and voltage capabilities, exemplary semiconductor packages may include one or more arrangements of creepage extension structures, lead frame structures that may include integral thermal pads, additional thermal elements, and combinations thereof. Creepage extension structures may be provided as part of top sides of semiconductor packages along with thermal pads of lead frame structures and additional thermal elements. Creepage extension structures may also be provided as part of top sides and along on one or more peripheral edges of semiconductor packages to promote further increases in power handling.

In one aspect, a semiconductor package comprises: a semiconductor die; a housing for the semiconductor die, the housing including a first side, a second side, and a creepage extension structure that is part of the first side; and a first lead electrically connected with the semiconductor die, the first lead including a thermal pad and at least one pin that extends away from the thermal pad, the thermal pad being arranged at the first side and adjacent to the creepage extension structure. In certain embodiments, the first side is a top side of the housing, and the second side is a bottom side of the housing that forms a mounting side of the housing. The semiconductor device may further comprise a second lead electrically connected with the semiconductor die, wherein the creepage extension structure is arranged between the thermal pad and the second lead.

In certain embodiments, the semiconductor die is a metal-oxide-semiconductor field-effect transistor (MOSFET), the first lead is electrically coupled to a drain of the MOSFET, and the second lead is electrically coupled to a source of the MOSFET. The semiconductor package may further comprise a third lead that is electrically coupled to a gate of the MOSFET, wherein the creepage extension structure is arranged between the thermal pad and the third lead. The semiconductor package may further comprise a fourth lead, wherein the creepage extension structure is arranged between the thermal pad and the fourth lead, and wherein the fourth lead is electrically coupled to a current sensor or a temperature sensor of the MOSFET. In certain embodiments, the MOSFET is a silicon carbide (SiC) based MOSFET. In certain embodiments, the semiconductor die is a Schottky diode, the first lead is electrically coupled to a first contact of the Schottky diode, and the second lead is electrically coupled to a second contact of the Schottky diode.

In certain embodiments, the housing forms a protrusion such that the first side includes a first width and a second width that is narrower than the first width, wherein the thermal pad is arranged within the first width and the creepage extension structure is arranged to extend from the first width to the second width. In certain embodiments, the creepage extension structure includes one or more trenches that extend into a first peripheral edge of the housing. In certain embodiments, the one or more trenches are laterally bounded by an outer surface of the housing on the first side of the housing. In certain embodiments, the one or more trenches are arranged to extend along one or more peripheral edges of the housing. In certain embodiments, the one or more trenches are arranged to extend across an entire width of the first side as measured between two opposing peripheral edges of the housing. The semiconductor package may further comprise an electrically insulating plate that is arranged on the thermal pad. In certain embodiments, the electrically insulating plate comprises a direct bonded copper plate. In certain embodiments, the thermal pad is integral with the first side.

In another aspect, a semiconductor package comprises: a semiconductor die; a first lead electrically coupled with the semiconductor die; a second lead electrically coupled with the semiconductor die; and a housing for the semiconductor die, the housing comprising: a first side, a second side, and a plurality of peripheral edges that are arranged between the first side and the second side; and a creepage extension structure that is part of a first peripheral edge of the plurality of peripheral edges. In certain embodiments, the creepage extension structure includes one or more trenches that extend into the first peripheral edge. In certain embodiments, the creepage extension structure is further part of a second peripheral edge of the plurality of peripheral edges, wherein the second peripheral edge is opposite the first peripheral edge. In certain embodiments, the creepage extension structure is further part of the first side of the housing. In certain embodiments, the creepage extension structure includes at least one trench that extends into the first peripheral edge and into the first side of the housing. In certain embodiments, the first lead comprises a thermal pad and at least one pin that extends away from the thermal pad, and wherein the thermal pad is arranged on the first side and adjacent to the creepage extension structure. The semiconductor package may further comprise an electrically insulating plate that is arranged on the thermal pad. In certain embodiments, the electrically insulating plate comprises a direct bonded copper plate. In certain embodiments, the semiconductor die is a metal-oxide-semiconductor field-effect transistor (MOSFET), the first lead is electrically coupled to a drain of the MOSFET, and the second lead is electrically coupled to a source of the MOSFET. In certain embodiments, the semiconductor die is a Schottky diode, the first lead is electrically coupled to a first contact of the Schottky diode, and the second lead is electrically coupled to a second contact of the Schottky diode.

In another aspect, a semiconductor package comprises: a semiconductor die; a first lead electrically coupled with the semiconductor die; a second lead electrically coupled with the semiconductor die; and a housing for the semiconductor die, the housing including a first side, a second side, and a creepage extension structure that is part of the housing, the creepage extension structure forming a number of trenches that extend into the housing to provide a creepage distance between the first lead and the second lead that is in a range from 12 millimeters (mm) to 20 mm. In certain embodiments, the number of trenches is at least one. In certain embodiments, the number of trenches is less than or equal to six. In certain embodiments, the creepage extension structure is part of the first side of the housing. In certain embodiments, the creepage extension structure is further part of one or more peripheral edges of the housing. In certain embodiments, the creepage extension structure is further part of the second side of the housing.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
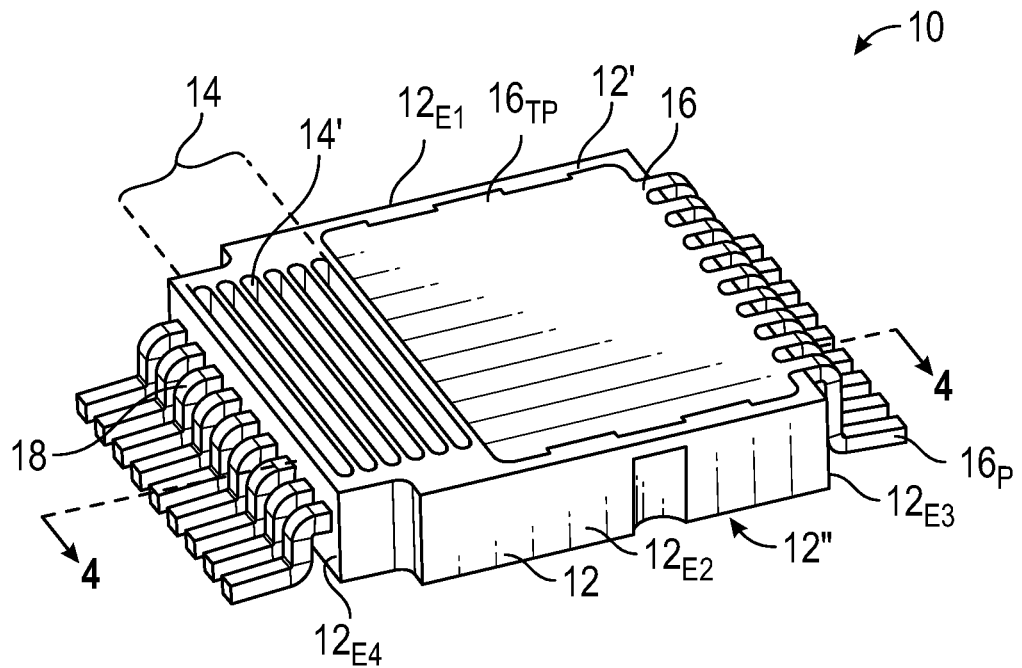
FIG. 1 is a top perspective view of a semiconductor package that includes a housing with a creepage extension structure formed therein according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Discrete semiconductor packages have been developed that include a semiconductor die, such as a metal-oxide-semiconductor field-effect transistor (MOSFET) or a Schottky diode. Such semiconductor packages with MOSFETs may be employed in a variety of applications to enable higher switching frequencies along with reduced associated losses, higher blocking voltages, and improved avalanche capabilities. Exemplary applications include high performance industrial power supplies, server/telecom power, electric vehicle charging systems, energy storage systems, uninterruptible power supplies, high-voltage DC/DC converters, and battery management systems. Discrete semiconductor packages with Schottky diodes may be employed in many of the same high-performance power applications described above for MOSFETs, sometimes in systems that also include discrete power packages of MOSFETs. As discussed above, the packaging technology for semiconductor devices plays an important role in defining the performance thereof. In particular, the packaging for semiconductor devices is often a limiting factor for the semiconductor die therein to dissipate heat, conduct current, and even switch at particular speeds.

The present disclosure relates to semiconductor packages, and more particularly to semiconductor packages with increased power handling capabilities. In certain aspects, exemplary semiconductor packages may include power semiconductor packages that include power semiconductor die. Semiconductor packages may include lead frame structures and corresponding housings that incorporate semiconductor die. To promote increased current and voltage capabilities, exemplary semiconductor packages may include one or more arrangements of creepage extension structures, lead frame structures that may include integral thermal pads, additional thermal elements, and combinations thereof. Creepage extension structures may be included anywhere as part of the semiconductor package. For example, the creepage extension structures may be part of top sides of semiconductor packages along with thermal pads of lead frame structures and additional thermal elements. Creepage extension structures may also be arranged as part of top sides and along or part of one or more peripheral edges of semiconductor packages to promote further increases in power handling.

FIG. 1 is a top perspective view of a semiconductor package 10 that includes a housing 12 with a creepage extension structure 14 formed therein. The semiconductor package 10 may be arranged to house and provide external electrical connections to a semiconductor die, for example a MOSFET or a Schottky diode, that is located within the housing 12. The semiconductor package 10 may be arranged as a surface mount technology (SMT) package such that a first side 12', or top side, of the housing 12 is positioned opposite an external surface, such as a printed circuit board (PCB), on which the semiconductor package 10 is mounted. Accordingly, a second side 12", or bottom side that is opposite the top side, of the housing 12 forms a mounting side of the semiconductor package 10 that is mounted to the external surface. A plurality of peripheral edges $12_{E1}$ to $12_{E4}$ may be arranged between the first side 12' and the second side 12". The housing 12 may be formed by a molding process such that the housing 12 is provided around portions of a first lead 16 and one or more second leads 18. In certain embodiments, the housing 12 may comprise a material capable of high temperature operation, such as a temperature of about 200° C. Exemplary materials for the housing include an epoxy material or an epoxy mold compound (EMC).

External electrical connections for the semiconductor package 10, and the included semiconductor die, may be provided by a lead frame structure that includes the first lead 16 and the one or more second leads 18. In certain embodiments, the first lead 16 includes a thermal pad $16_{TP}$ that is integrally formed with a plurality of integral pins 16P that extend away from the thermal pad $16_{TP}$. The pins 16P may promote flexibility in making external electrical connections for the first lead 16. As illustrated, the thermal pad $16_{TP}$ is provided on or integral with the first side 12' of the housing 12. In this manner, the thermal pad $16_{TP}$ may provide a heat dissipation path that is away from the second side 12" or mounting side of the housing 12. Accordingly, heat generated by the semiconductor die may be directed away from a mounting surface of the semiconductor package 10, thereby reducing thermal crowding. The pins 16P extend from the thermal pad $16_{TP}$, along the first side 12' and past the peripheral edge $12_{E3}$ of the housing 12 before being bent to extend downward. In this manner, when the semiconductor package 10 is mounted to an external surface, the pins 16P may be electrically coupled to one or more electrical connections of the external surface.

The creepage extension structure 14 is formed as part of the first side 12' of the housing 12 in a location that is between portions of the first lead 16 and the one or more second leads 18. In this manner, the creepage extension structure 14 may be configured to improve voltage isolation between the first and second leads 16, 18. Voltage isolation is an increasing challenge in semiconductor packages, particularly as package sizes continue to shrink. The creepage extension structure 14 effectively increases a surface distance, or creepage distance, along the housing 12 between the first and second leads 16, 18 without having to position the first and second leads 16, 18 farther apart, thereby allowing a smaller overall footprint of the semiconductor package 10. In certain embodiments, the creepage distance may be provided in a range from 5 millimeters (mm) to 20 mm, or in a range from 10 mm to 20 mm, or in a range from 12 mm to 20 mm, or in a range from 12 mm to 15 mm depending on the power handling capability of the semiconductor package 10. As illustrated, the creepage extension structure 14 may be formed as a number of slots or trenches 14' that extend into the housing 12 from the first side 12'. The creepage extension structure 14 may also be referred to as having a number of ribs or protrusions that are formed by portions of the housing 12 that are between the trenches 14'. The creepage extension structure 14 may be formed concurrently with molding of the housing 12 about the leads 16, 18. In certain embodiments, the creepage extension structure 14 is arranged only as part of the first side 12' and along a shortest path of the housing 12 that is between the first lead 16 and the one or more second leads 18.

Figure 2:
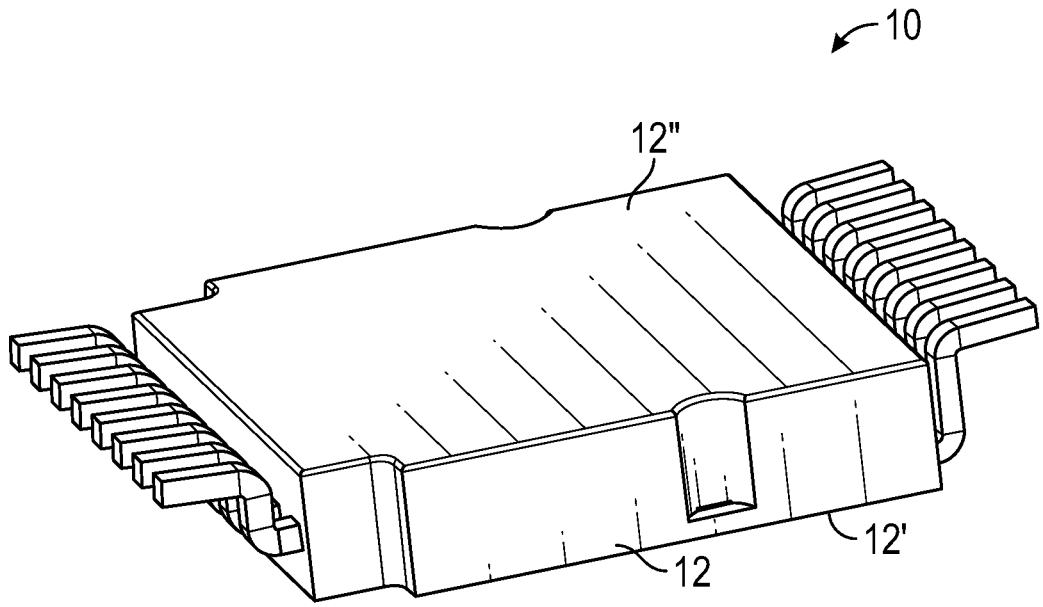
FIG. 2 is a bottom perspective view of the semiconductor package of FIG. 1.

FIG. 2 is a bottom perspective view of the semiconductor package 10 of FIG. 1. The second side 12" of the housing 12 may be configured as a mounting side or surface for the semiconductor package 10. With the thermal pad $16_{TP}$ and the creepage extension structure 14 are provided at the first side 12' as illustrated in FIG. 1, the second side 12" as illustrated in FIG. 2 may be substantially planar to facilitate mounting.

Figure 3:
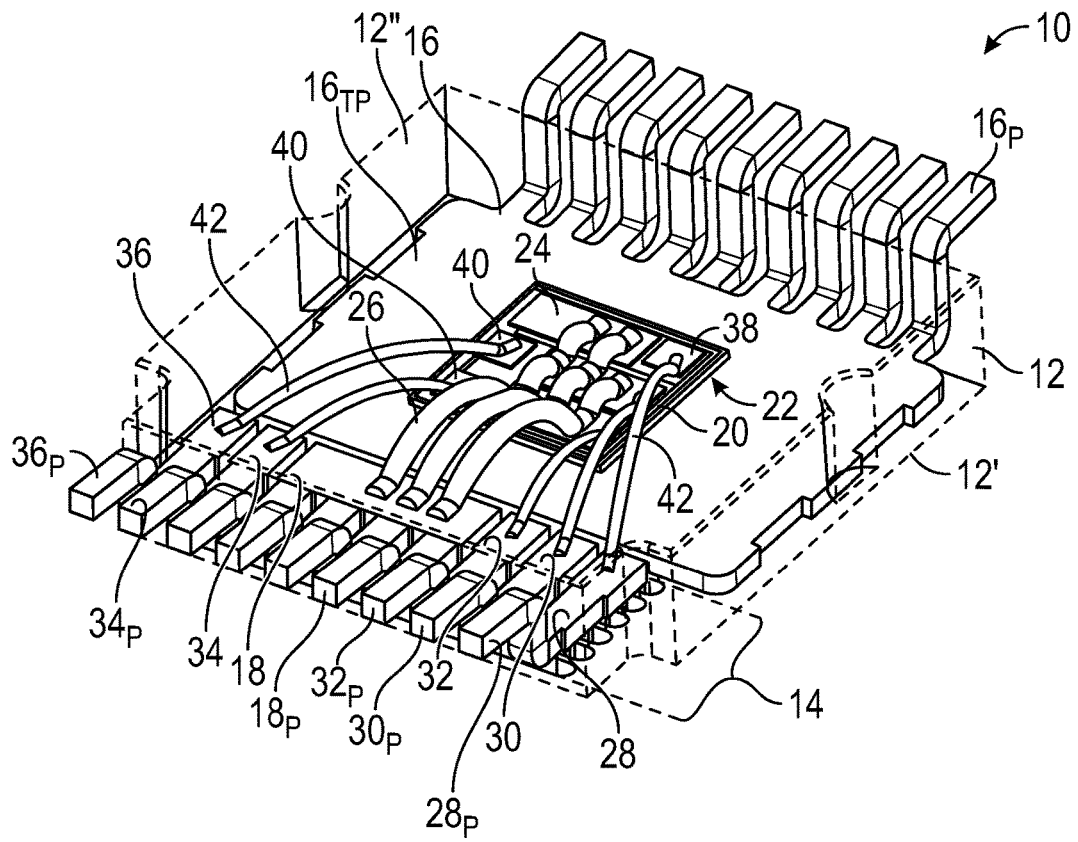
FIG. 3 is another bottom perspective view of the semiconductor package of FIG. 1 with the housing represented as transparent for illustrative purposes.

FIG. 3 is a bottom perspective view of the semiconductor package 10 of FIG. 1 with the housing 12 represented as transparent for illustrative purposes. As illustrated, a semiconductor die 20 may be provided on and electrically coupled to the thermal pad $16_{TP}$ of the first lead 16. In certain embodiments, the semiconductor die 20 may be attached to the first lead 16 by way of a die attach material, such as silver (Ag) sinter, gold-tin (AuSn) solder, and lead (Pb)-based solder, among others. In this manner, heat generated by the semiconductor die 20 may be dissipate through the thermal pad $16_{TP}$ to an exterior of the housing 12 at the first side 12'. As indicated above, the semiconductor die 20 may embody any number of power transistors or diodes, such as a MOSFET or a Schottky diode. In certain aspects, the semiconductor die 20 may be referred to as a power semiconductor die and the semiconductor package 10 may be referred to as a power semiconductor package. In certain embodiments, the semiconductor die 20 may embody a silicon carbide (SiC)-based MOSFET or Schottky diode. Due to the power handling and thermal dissipation capabilities described herein, the semiconductor die 20 may be provided with larger die sizes, such as a 7 mm by 7 mm die, although the principles disclosed are applicable to many different die sizes, for example smaller die sizes as low as 1 mm by 1 mm and even larger die sizes such as 7 mm by 9 mm.

The first lead 16 may further include the plurality of integral pins 16P that extend out of the housing 12 for increased current handling. In certain embodiments, the first lead 16 may be electrically coupled with a first contact 22 of the semiconductor die 20 that is located at the interface between the semiconductor die 20 and the thermal pad $16_{TP}$.

The second lead 18 may be electrically coupled to one or more second contacts 24 of the included semiconductor die 20. In the context of a MOSFET die, the first contact 22 may embody a drain contact while the one or more second contacts 24 embody source contacts of the MOSFET. In the context of a Schottky die, the first and second contacts 22, 24 may embody different ones of an anode and a cathode contact of the Schottky die. When multiple second contacts 24 are provided, wire bonds 26 may be provided that are electrically coupled with the second lead 18 and are employed to interconnect the second contacts 24 on the semiconductor die 20. The second lead 18 may include an expanded portion within the housing 12 that promotes flexibility in bonding locations for the wire bonds 26. For increased current handling, the second lead 18 may include multiple second pins 18P that extend out of the housing 12.

Depending on the application, a number of additional leads 28, 30, 32, 34, and 36 with corresponding pins 28P, 30P, 32P, 34P, and 36P may be arranged to extend out of a same edge of the housing 12 as the second pins 18P. Certain ones of the leads 30, 32, 34, and 36 may be electrically coupled to various portions of the semiconductor die 20. For example, the lead 28 may be coupled to a third contact 38 that embodies a gate contact of the MOSFET. In still further embodiments, regardless of the type of the semiconductor die 20, other leads 30, 32, 34, and 36 may be electrically coupled to the semiconductor die 20 for other functions, including smart sensing capabilities such as current sensing, temperature sensing, and/or sensing of other electronic signals. For example, the leads 30 and 32 may be electrically coupled to portions of the second contacts 24 to provide current sensing and/or Kelvin sensing while the leads 34, 36 may be electrically coupled to other contacts 40, such as temperature sensing contacts that are integrated with the semiconductor die 20. For high power applications, the wire bonds 26 for the one or more second contacts 24 may be thicker than wire bonds 42 for the other leads 28, 30, 32, 34, and 36. In still further embodiments, any one or even all of the leads 18, 28, 30, 32, 34, and 36 may be electrically coupled to the semiconductor die 20 with metal ribbons or metal clip interconnects, such as copper (Cu) clips.

Figure 4:
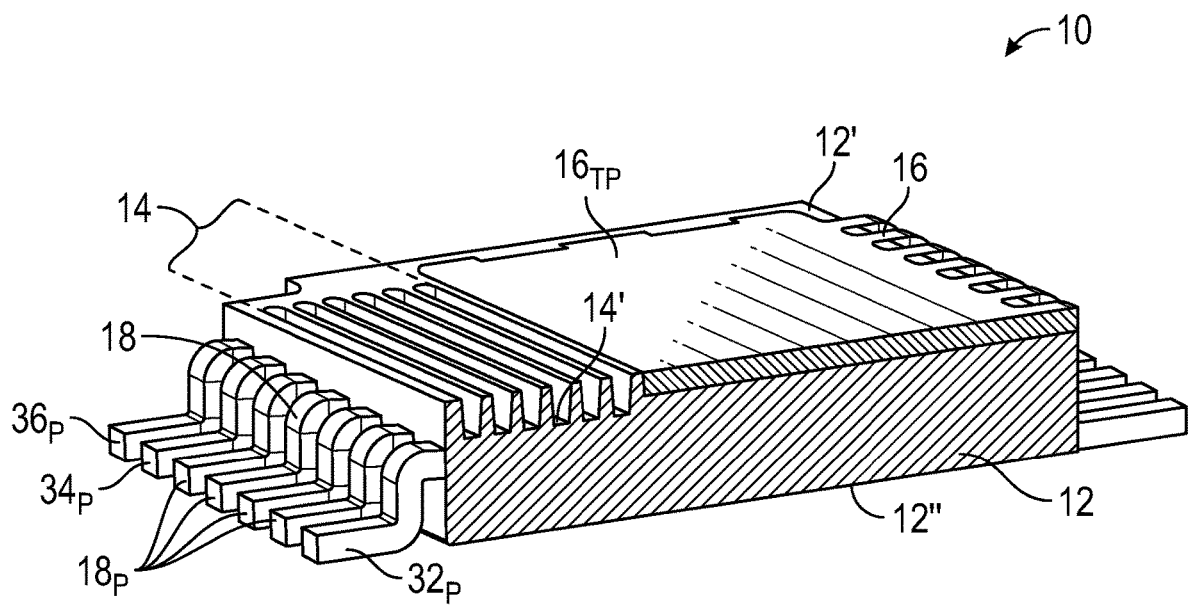
FIG. 4 is a perspective view of a cross-section of the semiconductor package taken along the sectional line 4-4 of FIG. 1.

FIG. 4 is a perspective view of a cross-section of the semiconductor package 10 taken along the sectional line 4-4 of FIG. 1. As illustrated, the creepage extension structure 14 is arranged only as part of the first side 12' of the housing 12 in order to extend a creepage distance along the surface of the housing 12 between the second lead 18 and the first lead 16. The creepage distance is also extended between the first lead 16 and any of the other leads 28, 30, 32, 34, and 36 as illustrated in FIG. 3. The creepage extension structure 14 may include multiple slots or trenches 14' that extend into the housing 12 from the first side 12' to a position of the housing 12 that is above the lead 18, and above any of the other leads 28, 30, 32, 34, and 36 as illustrated in FIG. 3. The relative numbers and dimensions of the trenches 14' of the creepage extension structure 14 may be determined based on industry adopted standards for a particular device voltage-current rating. For the embodiment of FIG. 4, the creepage extension structure 14 includes six trenches 14' extending into the housing 12 from the first side 12'. In other embodiments, a single trench 14' may be sufficient, while in still other embodiments, it may be necessary to have at least two trenches 14', or a number in a range from two to ten trenches 14', or two to fifteen trenches 14', among others based on the intended power handling of the device. The trenches 14' may be confined to the first side 12' such that an outer surface of the first side 12' laterally bounds each of the trenches 14'.

Figure 5:
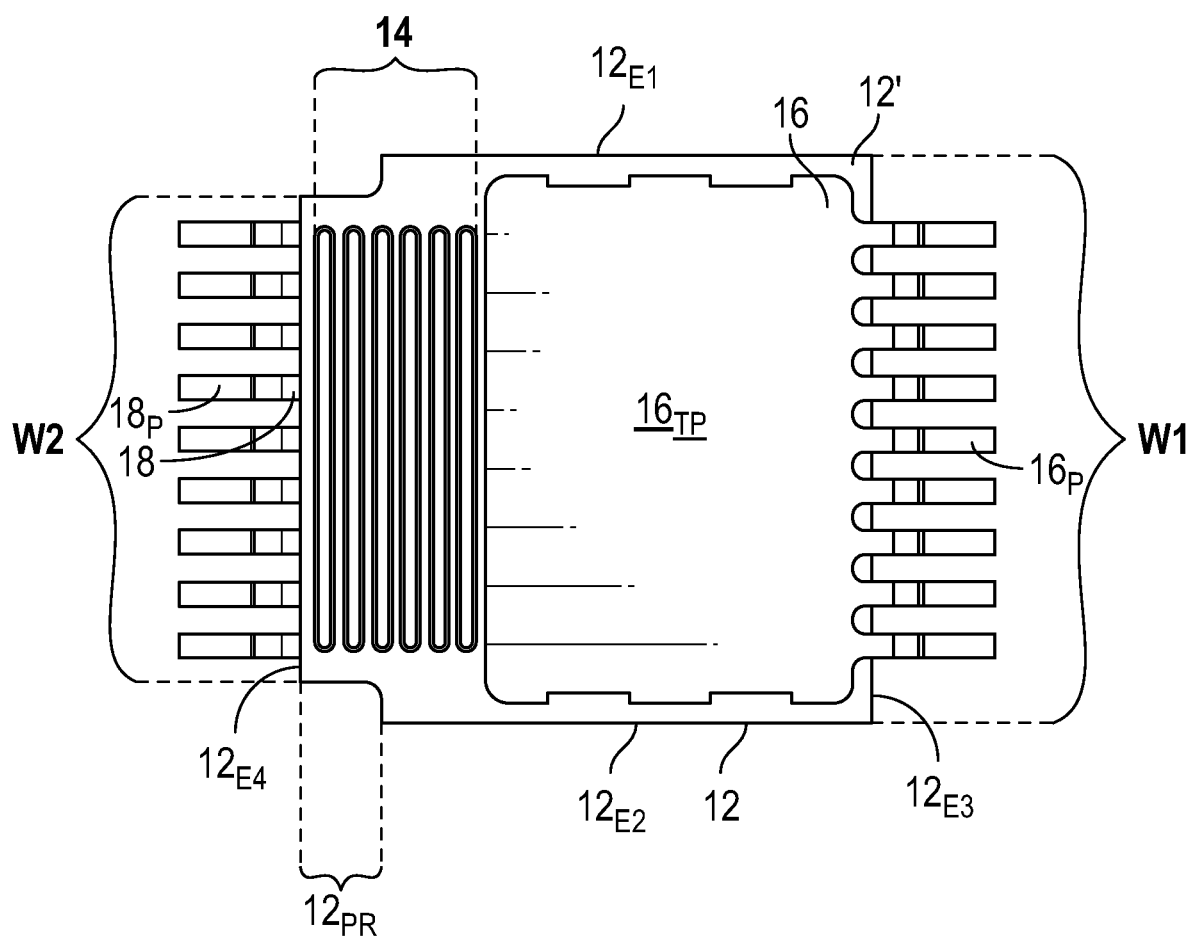
FIG. 5 is a top view of the semiconductor package of FIG. 1 illustrating relative dimensions of the creepage extension structure along a first side of the housing.

FIG. 5 is a top view of the semiconductor package 10 of FIG. 1 illustrating relative dimensions of the creepage extension structure 14 along the first side 12' of the housing 12. As illustrated, the semiconductor package 10 has a first width W1 as measured between two opposing peripheral edges $12_{E1}$, $12_{E2}$ of the housing 12 that extend between the other two opposing peripheral edges $12_{E3}$, $12_{E4}$ where the pins 16P and 18P respectively extend out of the housing 12. The first width W1 corresponds with a portion of the first side 12' that includes the thermal pad $16_{TP}$ and the underlying semiconductor die (20 of FIG. 3). The semiconductor package 10 also has a second width W2 as measured in a same direction as the first width W1, where the second width W2 is narrower than the first width W1. The second width W2 corresponds with a protrusion $12_{PR}$ of the housing 12 that includes a portion of the creepage extension structure 14. As illustrated, the thermal pad $16_{TP}$ occupies a larger width than the creepage extension structure 14 as measured in the same direction as the first and second widths W1 and W2. The creepage extension structure 14 may traverse the first side 12' of the housing from a position within the first width W1 that is proximate or adjacent the thermal pad $16_{TP}$ to another position within the second width W2 that is proximate or adjacent the second lead 18.

The protrusion $12_{PR}$ effectively forms an extension of the housing 12 to accommodate at least a portion of the creepage extension structure 14. By forming the protrusion $12_{PR}$ with the narrower second width W2, an overall amount of material for the housing 12 may be reduced while still maintaining enough space for the creepage extension structure 14. Such an arrangement may advantageously provide a lighter weight, lower package costs, and improved moisture sensitivity. With regard to moisture sensitivity, the material of the housing 12, such as EMC, may be moisture absorbing. When the package is mounted to an exterior surface, such as a PCB, associated heating necessary for reflow to connect solder to the lead frame structure may cause moisture within the material of the housing 12 to escape. If the distance for the moisture to escape is too long within the housing 12, then internal pressure can cause delamination during the reflow process. Accordingly, the narrower width W2 of the protrusion $12_{PR}$ is provided to accommodate the creepage extension structure 14 without adding too much unnecessary material of the housing 12.

In certain semiconductor packages, the structure of the housing may form a shortest creepage distance that traverses peripheral edges of the housing. This may be due to relative locations of leads that extend from the housing, locations of creepage extension structures, and combinations thereof. In such instances, high voltages between package leads may travel along one or more peripheral edges of a housing, even if creepage extension structures are present on top or bottom sides of the housing. According to aspects of the present disclosure, creepage extension structures may be arranged along one or more peripheral edges of a housing. In further aspects, a creepage extension structure may be arranged as part of a first side and/or second side of the housing, as well as part of one or more peripheral edges of the housing, thereby extending creepage distances along multiple edges and/or sides of the housing.

Figure 6:
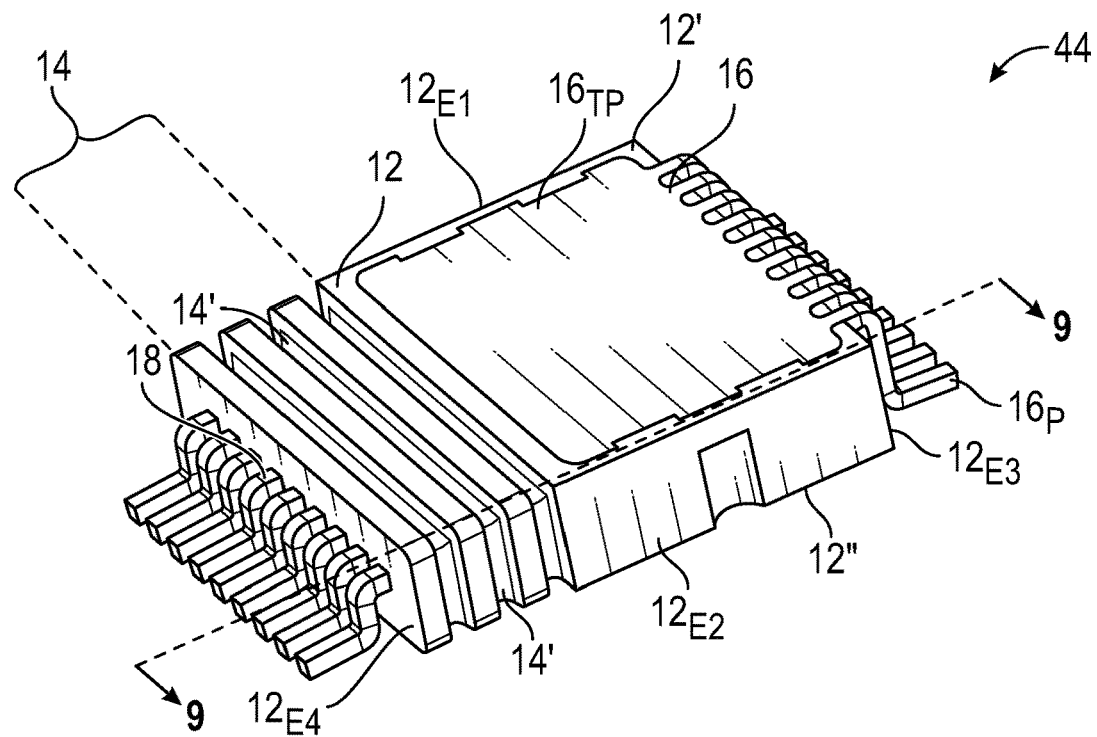
FIG. 6 is a top perspective view of a semiconductor package that is similar to the semiconductor package of FIG. 1 and includes an arrangement of the creepage extension structure that extends beyond the first side of the housing.
Figure 7:
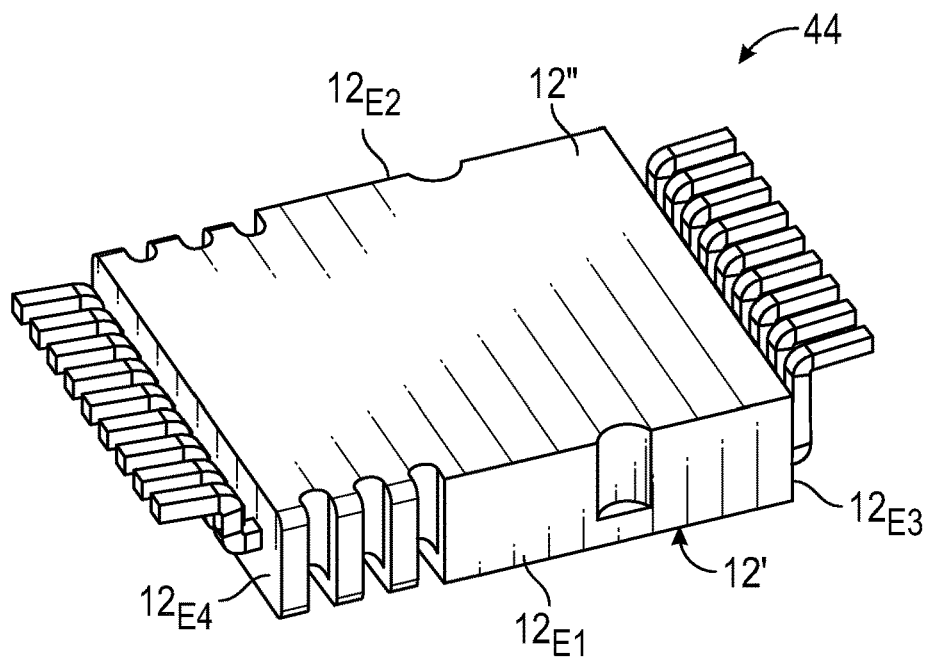
FIG. 7 is a bottom perspective view of the semiconductor package of FIG. 6.

FIG. 6 is a top perspective view of a semiconductor package 44 that is similar to the semiconductor package 10 of FIG. 1 and includes an arrangement of the creepage extension structure 14 that extends beyond the first side 12' of the housing 12. FIG. 7 is a bottom perspective view of the semiconductor package 44 of FIG. 6. In certain embodiments, the creepage extension structure 14 is arranged as part of the first side 12' and as part of at least two opposing edges $12_{E1}$, $12_{E2}$ of the housing 12. In particular, the portion of the two opposing edges $12_{E1}$, $12_{E2}$ where the creepage extension structure 14 resides may be positioned between the first lead 16 and the second lead 18 (or any of the other leads 28 to 36 as illustrated in FIG. 3). As illustrated, the trenches 14' of the creepage extension structure 14 extend into the first side 12' and into the opposing edges $12_{E1}$, $12_{E2}$. Depending on the arrangement of the first lead 16 and the second lead 18 (or any of the other leads 28 to 36 as illustrated in FIG. 3) the creepage extension structure 14 may be provided as part of a single peripheral edge $12_{E1}$ or $12_{E2}$ of the housing 12. Additionally, for embodiments where the first lead 16 does not include the thermal pad $16_{TP}$, the arrangement of the first and second leads 16, 18 (or any of the other leads 28 to 36 as illustrated in FIG. 3) may be such that the creepage extension structure 14 is only part of one or more of the edges $12_{E1}$, $12_{E2}$ of the housing 12. In still further embodiments, the creepage extension structure 14 may be part of the first side 12', the second side 12", and both of the edges $12_{E1}$, $12_{E2}$ of the housing 12.

Figure 8:
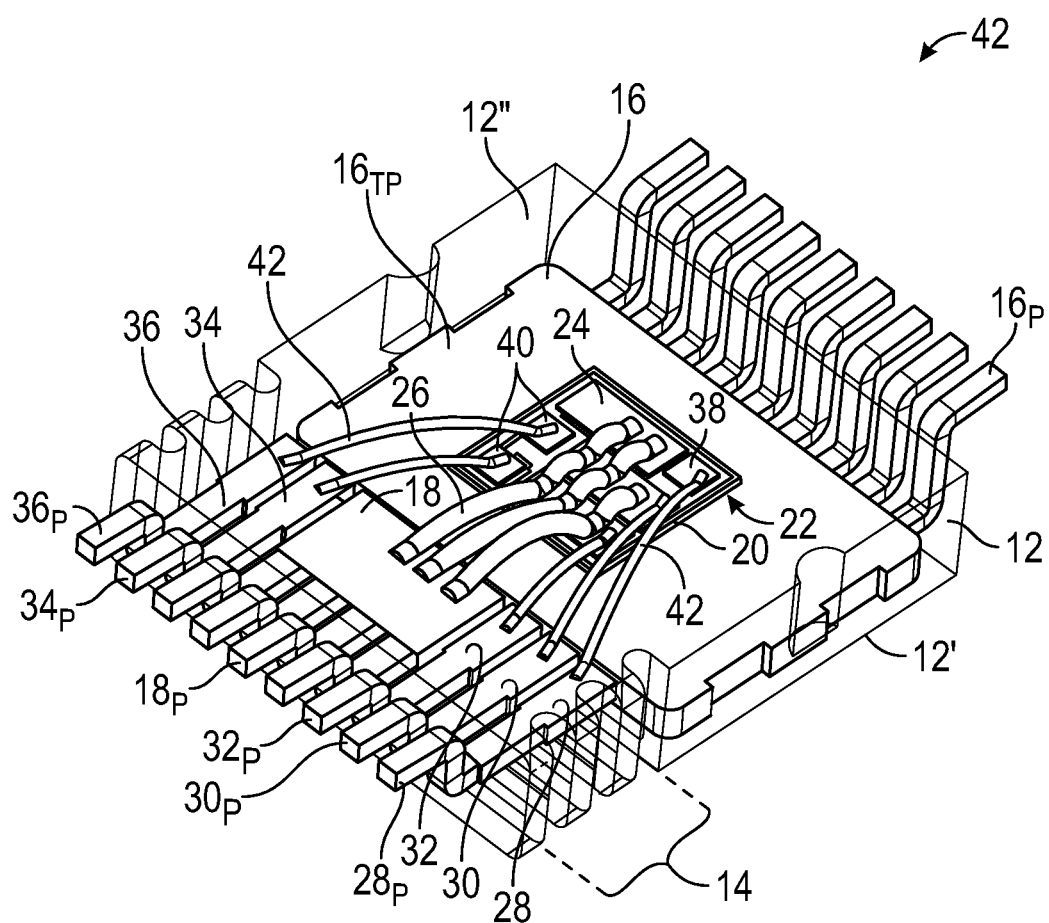
FIG. 8 is a bottom perspective view of the semiconductor package of FIG. 6 with the housing represented as transparent for illustrative purposes.

FIG. 8 is a bottom perspective view of the semiconductor package 44 of FIG. 6 with the housing 12 represented as transparent for illustrative purposes. In this manner, the view of the semiconductor package 44 provided in FIG. 8 is similar to the view of the semiconductor package 10 provided by FIG. 3. Differences include the arrangement of the creepage extension structure 14 as described above for FIG. 6 and relative dimensions of the lead frame structure based on a targeted power handling capability for the semiconductor package 44. For example, one or more, or even all of the leads 16, 18, 28, 30, 32, 34, and 36 may be formed with a greater thickness than those of the semiconductor package 10 of FIG. 3. In the context of the semiconductor package 44, such thickness values may be measured in a perpendicular direction from the first side 12' to the second side 12". In certain embodiments, a thickness of one or more of the leads 16, 18, 28, 30, 32, 34, and 36 may be in a range from greater than 0.75 mm to 2 mm, or in a range from 0.75 mm to 1.5 mm. For contrast, the same thickness dimensions for the semiconductor package 10 of FIG. 3 may be less than 0.75 mm, such as in a range from 0.4 mm to 0.6 mm. By providing a greater thickness for one or more portions of the lead frame structure in combination with the arrangement of the creepage extension structure 14 as described above for FIG. 6, the semiconductor package 44 may exhibit even higher power handling and heat dissipation than the semiconductor package 10 of FIG. 3.

Figure 9:
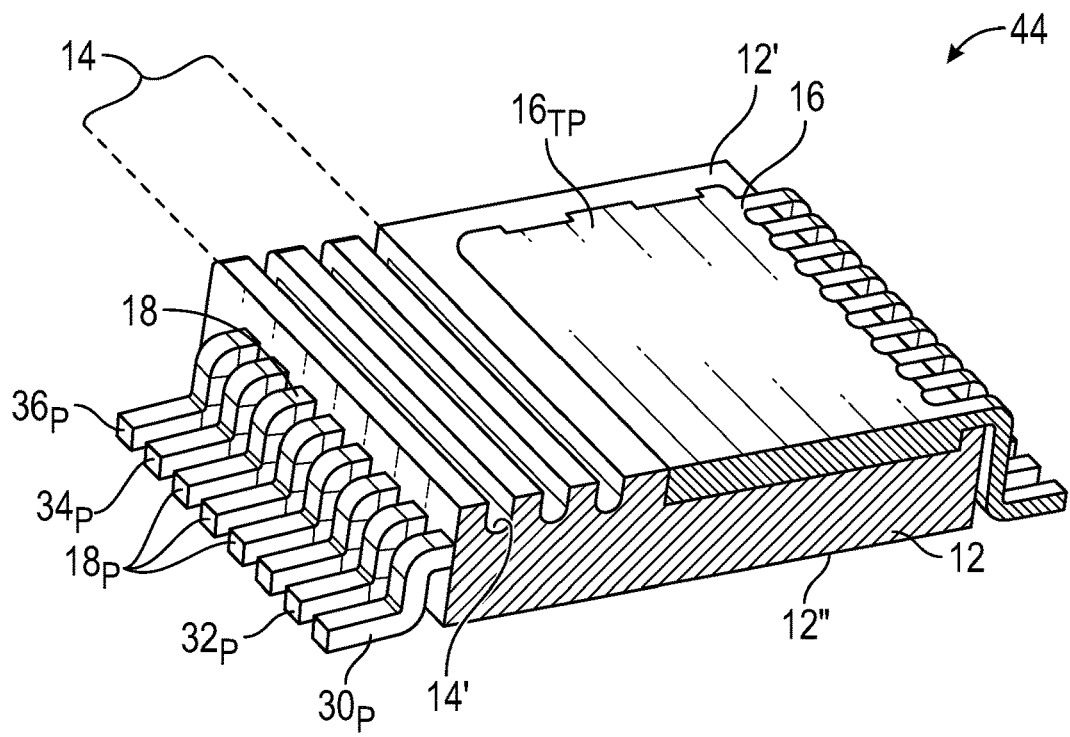
FIG. 9 is a perspective view of a cross-section of the semiconductor package taken along the sectional line 9-9 of FIG. 6.

FIG. 9 is a perspective view of a cross-section of the semiconductor package 44 taken along the sectional line 9-9 of FIG. 6. As described above for FIG. 6, the creepage extension structure 14 for the semiconductor package 44 is arranged to extend along the first side 12' of the housing 12 and one or more of the peripheral edges ($12_{E1}$, $12_{E2}$ of FIG. 6) thereof. When the creepage extension structure 14 is confined to only the first side 12', mold limitations for the housing 12 may only allow certain depths for the trenches 14'. By extending the creepage extension structure 14 from the first side 12' and along one or more of the peripheral edges ($12_{E1}$, $12_{E2}$ of FIG. 6), increased flexibility of molding options for the housing 12 may allow the trenches 14' to be formed deeper into the housing 12. In this regard, greater depths for the trenches 14' may reduce the number of trenches 14' needed to maintain a same creepage distance. For example, no more than five trenches 14' or no more than three trenches 14' may provide a creepage distance between the leads 16, 18 that is in a range from 10 mm to 20 mm, or in a range from 12 mm to 15 mm. As illustrated in FIG. 9, three trenches 14' are provided. In other embodiments and depending on the power handling requirements, any number of the trenches 14' may be provided, such as in a range from two to twenty trenches 14', or in a range from two to ten trenches 14', or in a range from two to five trenches 14' while still providing desired power handling capabilities. Additionally, greater depths for the trenches 14' may also allow a reduced footprint for the semiconductor package 44 while also maintaining a targeted creepage distance. In certain embodiments, bottoms of the trenches 14' within the housing 12 may be formed with rounded surfaces due to the increased flexibility of molding options.

Figure 10:
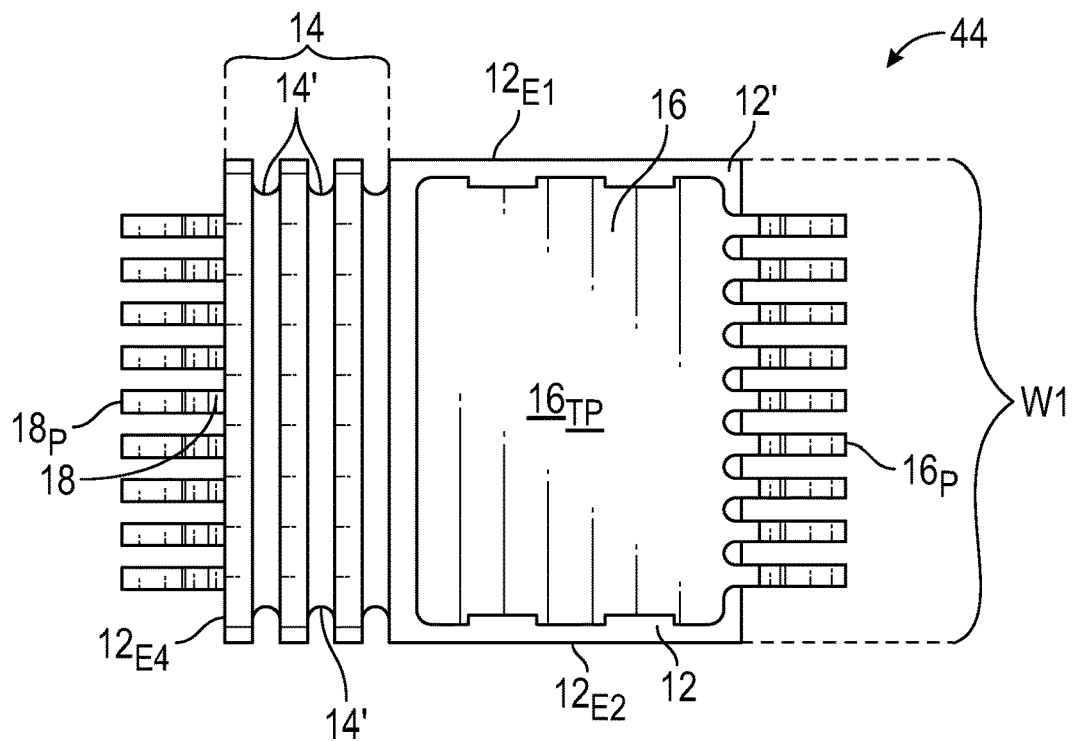
FIG. 10 is a top view of the semiconductor package of FIG. 6 illustrating relative dimensions of the creepage extension structure along the first side of the housing.

FIG. 10 is a top view of the semiconductor package 44 of FIG. 6 illustrating relative dimensions of the creepage extension structure 14 along the first side 12' of the housing 12. In a similar manner as described above for FIG. 5, the first width W1 is defined as the distance between the two opposing edges $12_{E1}$, $12_{E2}$ of the housing 12 that are different from the other two opposing edges $12_{E3}$, $12_{E4}$ where the pins 16P and 18P extend out of the housing 12. Since the creepage extension structure 14 extends across the entire first side 12', the creepage extension structure 14 may also be defined by the first width W1. The top view provided by FIG. 10 also illustrates how the trenches 14' are arranged to extend into the peripheral edges $12_{E1}$, $12_{E2}$ of the housing 12. For embodiments that include the thermal pad $16_{TP}$, the creepage extension structure 14 may reside along portions of the first side 12' that are proximate or adjacent the thermal pad $16_{TP}$ and in between the first lead 16 and the second lead 18.

Figure 11:
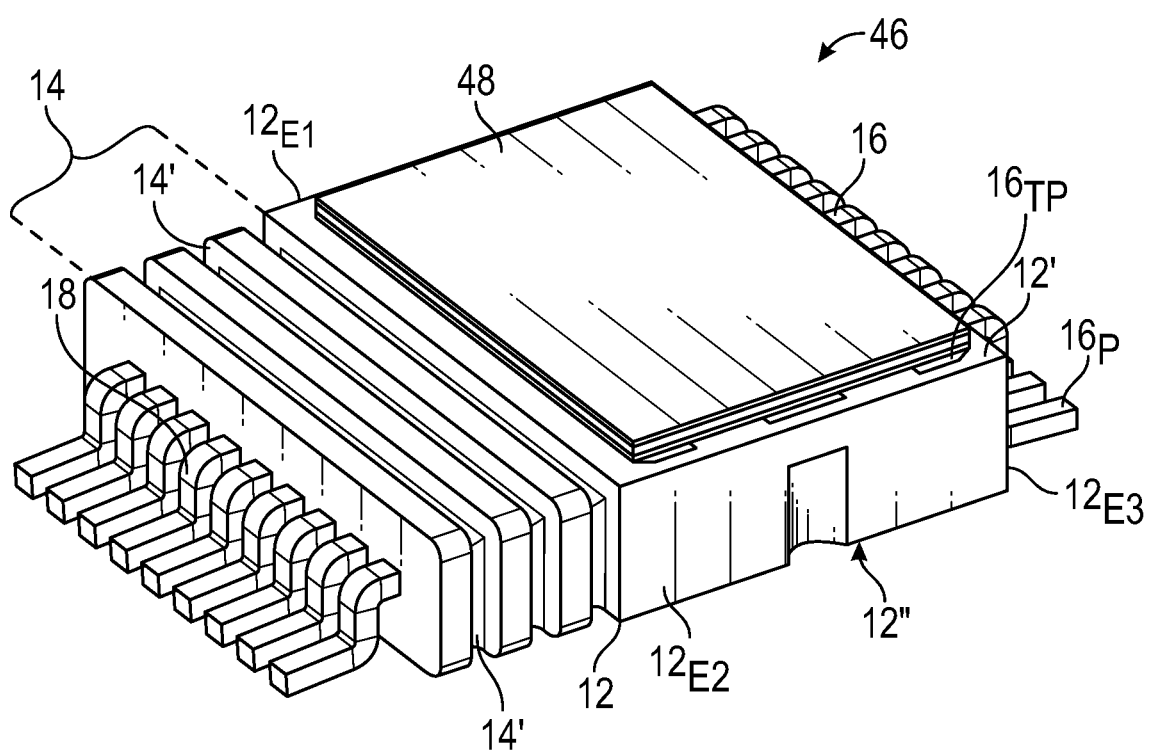
FIG. 11 is a top perspective view of a semiconductor package that is similar to the semiconductor package of FIG. 6 and further includes an electrically insulating plate that is arranged on a thermal pad of a first lead.

FIG. 11 is a top perspective view of a semiconductor package 46 that is similar to the semiconductor package 44 of FIG. 6 and further includes an electrically insulating plate 48 that is arranged on the thermal pad $16_{TP}$ of the first lead 16. The electrically insulating plate 48 may comprise a thermally conductive material such as ceramic including aluminum nitride and/or aluminum oxide, or a direct bonded copper (DBC) plate. In this regard, the electrically insulating plate 48 may serve to further enhance heat dissipation from the first side 12' while also providing electrical isolation along the first side 12'. In such a configuration, external electrical connections for the first lead 16 may be received by the pins 16P. Accordingly, the semiconductor package 46 may accommodate a larger semiconductor die and/or increased power handling. In the context of a DBC plate which includes a center ceramic layer sandwiched between two surfaces of copper, the center ceramic layer thus provides the electrical isolation along the first side 12'. While the electrically insulating plate 48 is provided in the context of FIG. 11, the electrically insulating plate 48 may also be provided on the thermal pad $16_{TP}$ of the semiconductor package 10 of FIG. 1 in a similar manner.

As described above for the embodiments of FIGS. 1 to 11, exemplary structures for semiconductor packages are disclosed that enable increased power handling. Such structures include arrangements of creepage extension structures, lead frame structures that may include integral thermal pads, and additional thermal elements such as electrically insulting plates. In the context of power semiconductor packages with MOSFETS, such as SiC-based MOSFETs, power handling for any of the embodiments of FIGS. 1 to 11 may include voltage-current ratings in a range from 1700 volts (V) to 1900 V with currents of up to about 250 amperes (A), or up to about 400 A. Voltage ranges may be related to package sizes and/or creepage distances while current ratings may be related to selection of interconnect structures including wire bonds, metal ribbons, and/or metal clips.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor package comprising:
   a semiconductor die;
   a housing for the semiconductor die, the housing comprising a first material and including a first side, a second side, and a creepage extension structure of the first material that is part of the first side and comprises at least one trench; and
   a first lead electrically connected with the semiconductor die, the first lead including a thermal pad and at least one pin that extends away from the thermal pad, the thermal pad comprising a second material that is different from the first material and being arranged at the first side and adjacent to the creepage extension structure.

2. The semiconductor package of claim 1, wherein the first side is a top side of the housing, and the second side is a bottom side of the housing that forms a mounting side of the housing.

3. The semiconductor package of claim 1, further comprising:
   a second lead electrically connected with the semiconductor die,
   wherein the creepage extension structure is arranged between the thermal pad and the second lead, and wherein a creepage distance along a surface of the housing having the at least one trench therein is greater than a shortest path between the thermal pad of the first lead and the second lead.

4. The semiconductor package of claim 3, wherein the semiconductor die is a metal-oxide-semiconductor field-effect transistor (MOSFET), the first lead is electrically coupled to a drain of the MOSFET, and the second lead is electrically coupled to a source of the MOSFET.

5. The semiconductor package of claim 4, further comprising a third lead that is electrically coupled to a gate of the MOSFET, wherein the creepage extension structure is arranged between the thermal pad and the third lead.

6. The semiconductor package of claim 5, further comprising a fourth lead, wherein the creepage extension structure is arranged between the thermal pad and the fourth lead, and wherein the fourth lead is electrically coupled to a current sensor or a temperature sensor of the MOSFET.

7. The semiconductor package of claim 4, wherein the MOSFET is a silicon carbide (SiC) based MOSFET.

8. The semiconductor package of claim 3, wherein the semiconductor die is a Schottky diode, the first lead is electrically coupled to a first contact of the Schottky diode, and the second lead is electrically coupled to a second contact of the Schottky diode.

9. The semiconductor package of claim 1, wherein the housing forms a protrusion such that the first side includes a first width between opposing peripheral edges of the housing and a second width between the opposing peripheral edges that is narrower than the first width, wherein the thermal pad is arranged within the first width and the creepage extension structure is arranged to extend from the first width to the second width.

10. The semiconductor package of claim 1, wherein the at least one trench comprises one or more trenches that extend into a first peripheral edge of the housing.

11. The semiconductor package of claim 10, wherein the one or more trenches are laterally bounded by an outer surface of the housing on the first side of the housing.

12. The semiconductor package of claim 10, wherein the one or more trenches are arranged to extend along one or more peripheral edges of the housing.

13. The semiconductor package of claim 10, wherein the one or more trenches are arranged to extend across an entire width of the first side as measured between two opposing peripheral edges of the housing.

14. The semiconductor package of claim 1, further comprising an electrically insulating plate that is arranged on the thermal pad.

15. The semiconductor package of claim 14, wherein the electrically insulating plate comprises a direct bonded copper plate.

16. The semiconductor package of claim 1, wherein the thermal pad is integral with the first side.

17. A semiconductor package comprising:
a semiconductor die;
a first lead electrically coupled with the semiconductor die;
a second lead electrically coupled with the semiconductor die; and
a housing for the semiconductor die, the housing comprising:
a first side, a second side, and a plurality of peripheral edges of a first material, wherein the plurality of peripheral edges are arranged between the first side and the second side; and
a creepage extension structure of the first material that is part of the first side and is part of a first peripheral edge of the plurality of peripheral edges, wherein the creepage extension structure comprises at least one trench.

18. The semiconductor package of claim 17, wherein the at least one trench comprises one or more trenches that extend into the first peripheral edge.

19. The semiconductor package of claim 17, wherein the creepage extension structure is further part of a second peripheral edge of the plurality of peripheral edges, wherein the second peripheral edge is opposite the first peripheral edge.

20. The semiconductor package of claim 17, wherein the at least one trench extends into the first peripheral edge and into the first side of the housing.

21. The semiconductor package of claim 17, wherein the first lead comprises a thermal pad and at least one pin that extends away from the thermal pad, and wherein the thermal pad is arranged on the first side and adjacent to the creepage extension structure.

22. The semiconductor package of claim 21, further comprising an electrically insulating plate that is arranged on the thermal pad.

23. The semiconductor package of claim 22, wherein the electrically insulating plate comprises a direct bonded copper plate.

24. The semiconductor package of claim 17, wherein the semiconductor die is a metal-oxide-semiconductor field-effect transistor (MOSFET), the first lead is electrically coupled to a drain of the MOSFET, and the second lead is electrically coupled to a source of the MOSFET.

25. The semiconductor package of claim 17, wherein the semiconductor die is a Schottky diode, the first lead is electrically coupled to a first contact of the Schottky diode, and the second lead is electrically coupled to a second contact of the Schottky diode.

26. A semiconductor package comprising:
a semiconductor die;
a first lead electrically coupled with the semiconductor die;
a second lead electrically coupled with the semiconductor die; and
a housing for the semiconductor die, the housing including a first side, a second side, and a creepage extension structure that is part of the housing and is configured to provide voltage isolation between the first lead and the second lead, the creepage extension structure forming a number of trenches that extend into the housing to provide a creepage distance between the first lead and the second lead that is in a range from 12 millimeters (mm) to 20 mm.

27. The semiconductor package of claim 26, wherein the number of trenches is at least one.

28. The semiconductor package of claim 27, wherein the number of trenches is less than or equal to six.

29. The semiconductor package of claim 26, wherein the creepage extension structure is part of the first side of the housing and includes a surface of the housing having the trenches therein.

30. The semiconductor package of claim 29, wherein the creepage extension structure is further part of one or more peripheral edges of the housing.

31. The semiconductor package of claim 30, wherein the creepage extension structure is further part of the second side of the housing.

32. The semiconductor package of claim 29, wherein the first lead comprises a thermal pad arranged on the first side and adjacent to the creepage extension structure, and wherein the creepage distance along the surface of the housing is greater than a shortest path between the thermal pad of the first lead and the second lead.

33. The semiconductor package of claim 1, wherein the first material is configured to provide voltage isolation between the first lead and a second lead electrically connected with the semiconductor die.

* * * * *